US010269988B2

(12) United States Patent
Lee et al.

(10) Patent No.: US 10,269,988 B2
(45) Date of Patent: Apr. 23, 2019

(54) SEMICONDUCTOR DEVICE AND MANUFACTURING METHOD THEREOF

(71) Applicant: MagnaChip Semiconductor, Ltd., Cheongju-si (KR)

(72) Inventors: Yong Won Lee, Bucheon-si (KR); Jin Woo Han, Bucheon-si (KR); Dae Won Hwang, Seoul (KR); Kyung Wook Kim, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 4 days.

(21) Appl. No.: 14/314,418

(22) Filed: Jun. 25, 2014

(65) Prior Publication Data

US 2015/0123235 A1 May 7, 2015

(30) Foreign Application Priority Data

Nov. 4, 2013 (KR) ......................... 10-2013-0132769

(51) Int. Cl.
*H01L 29/872* (2006.01)
*H01L 29/78* (2006.01)
*H01L 29/66* (2006.01)
*H01L 29/06* (2006.01)
*H01L 29/40* (2006.01)

(52) U.S. Cl.
CPC ........ *H01L 29/872* (2013.01); *H01L 29/0619* (2013.01); *H01L 29/66143* (2013.01); *H01L 29/66734* (2013.01); *H01L 29/7806* (2013.01); *H01L 29/7813* (2013.01); *H01L 29/407* (2013.01)

(58) Field of Classification Search
CPC ............... H01L 21/872; H01L 21/0435; H01L 29/7825; H01L 29/7806; H01L 29/7813; H01L 29/66143; H01L 27/0727; H01L 29/872; H01L 29/0619; H01L 29/407
See application file for complete search history.

(56) References Cited

U.S. PATENT DOCUMENTS

| 6,710,403 | B2 * | 3/2004 | Sapp | .................. H01L 29/7813 257/228 |
| 7,436,022 | B2 | 10/2008 | Bhalla et al. | |
| 2012/0098058 | A1 * | 4/2012 | Zhang | ............... H01L 29/66734 257/330 |

(Continued)

FOREIGN PATENT DOCUMENTS

| CN | 101621062 A | 1/2010 | |
| CN | 103022156 A | 4/2013 | |
| WO | WO 2013/079304 A1 * | 6/2013 | ........... H01L 29/872 |

OTHER PUBLICATIONS

Chinese Office Action dated May 3, 2018 in counterpart Chinese Patent Application No. 20140366838.2. (8 pages in Chinese).

*Primary Examiner* — William F Kraig
*Assistant Examiner* — Khatib Rahman
(74) *Attorney, Agent, or Firm* — NSIP Law

(57) ABSTRACT

A semiconductor device includes a substrate, a counter-doping region, and a Schottky barrier diode (SBD) in which a breakdown voltage is improved by using counter doping, and a manufacturing method thereof. A breakdown voltage may be improved by lowering a concentration of impurity on the region and enhancing the characteristics of the semiconductor device including the SBD.

17 Claims, 18 Drawing Sheets

(56) References Cited

U.S. PATENT DOCUMENTS

| | | | |
|---|---|---|---|
| 2013/0285136 A1* | 10/2013 | Lu | H01L 29/872 257/328 |
| 2014/0073098 A1* | 3/2014 | Calafut | H01L 27/06 438/237 |
| 2015/0028445 A1* | 1/2015 | Qu | H01L 29/861 257/483 |
| 2015/0097238 A1* | 4/2015 | Zhang | H01L 29/6659 257/347 |

* cited by examiner

SEMICONDUCTOR DEVICE AND MANUFACTURING METHOD THEREOF

CROSS-REFERENCE TO RELATED APPLICATIONS

This application claims the benefit under 35 USC 119(a) of Korean Patent Application No. 10-2013-0132769 filed on Nov. 4, 2013, in the Korean Intellectual Property Office, the entire disclosure of which is incorporated herein by reference for all purposes.

BACKGROUND

1. Field

The following description relates to a semiconductor device and a manufacturing method thereof. A semiconductor device may be configured to reduce a doping concentration at an active region and enhance a breakdown voltage by performing counter doping to a region where a Schottky barrier diode is formed.

2. Description of Related Art

In order to increase a switching speed of a semiconductor electricity device and to reduce a power consumption, reduction of an on-resistance and a gate capacitance is preferred. For the reduction, a method of incorporating a Schottky Barrier Diode (SBD) into the semiconductor electricity device, such as a metal-oxide semiconductor field effect transistor (MOSFET) has typically been applied.

A Schottky Barrier Diode (SBD) forms the Schottky Barrier by means of a junction between metal and semiconductor. That is, such metal-semiconductor junction is formed between a metal and a semiconductor, creating a Schottky barrier. Typical metals used are molybdenum, platinum, chromium or tungsten, and certain silicides, e.g. palladium silicide and platinum silicide; and the semiconductor would typically be n-type silicon. The metal side acts as the anode and the n-type semiconductor acts as the cathode of the diode. This Schottky barrier results in both very fast switching and low forward voltage drop.

With regards to a MOSFET embedded with an SBD which uses drift current of various carriers, a time delay by charge accumulation due to an injection of a few carriers is not generated, thus, a fast switching may become possible. Also, efficiencies are improved as switching frequency increases.

However, the SBD has disadvantages in that a maximum reverse voltage is low and a reverse direction leakage current is heavy. Also, with regards to a semiconductor device embedded with the SBD, a Breakdown voltage (BV) of the Schottky barrier diode is determined according to a Barrier Metal and an EPI Resistivity. Therefore, if a high concentration Epitaxial layer having a low resistivity is used in a semiconductor device in which the SBD is embedded, an on-Resistance (RDS(ON)) may be disrupted due to the increase of the resistance in the MOSFET drift region.

FIG. 1 is a diagram illustrating an example of a graph of a breakdown voltage change value, according to an EPI Resistivity of a semiconductor device embedded with a usual MOSFET (B) and a conventional Schottky barrier diode (A). As illustrated in FIG. 1, it should be appreciated that a breakdown voltage value is lower than the MOSFET (B) for an identical value of the EPI Resistivity.

Conventionally, to solve this problem, minimization of an electric field was attempted by applying a Guard Ring or a trench field plate. However, this method has a limitation because the distribution characteristic of the electric field on the substrate surface of the semiconductor device is largely different from the theoretically targeted range.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device includes a substrate having a concentration, a counter doping region having another concentration, and a Schottky barrier diode ("SBD") comprising the counter doping region.

The semiconductor device may further include a metal layer in contact with the counter doping region, wherein the substrate has a conductivity type; the counter doping region is disposed in the substrate; the another concentration is lower than the concentration; and the SBD further comprises the metal layer.

The semiconductor device may further include a WELL region and a BODY region which have another conductivity type and are disposed in the substrate.

The counter doping region may include a first doping region disposed in a top portion of the substrate; a second doping region disposed in the WELL region; and a third doping region disposed in the BODY region.

The third doping region may have a higher doping concentration than that of the second doping region.

The semiconductor device may further include a first trench having a first depth in the substrate and a second trench having a second depth in the substrate which is lower than the first depth.

The first trench may be disposed in a boundary between a MOSFET region and an SBD region.

The BODY region may include a first BODY region and a second BODY region, the WELL region may include a first WELL region, a second WELL region, and a third WELL region, and the first BODY region may be enclosed by the first WELL region or the third WELL region.

The first trench may include a top Poly-Si layer, a bottom Poly-Si layer, and an insulating layer which is disposed between the top Poly-Si layer and the bottom Poly-Si layer.

The BODY region may have a smaller depth than the WELL region.

The semiconductor device may further include a WELL region, wherein a depth of the WELL region is less than a depth of the first trench or the second trench.

In another general aspect, a manufacturing method includes forming a substrate, forming a counter doping region in the substrate region, forming a trench in the substrate region, forming a BODY region adjacent to the trench, and forming a WELL region adjacent to the trench.

The forming a substrate may include forming a substrate having a conductivity type, the forming a counter doping region may include forming a counter doping region having another conductivity type, the forming a trench may include forming a plurality of trenches, the forming a BODY region may include forming a BODY region having the another conductivity type, and the forming a WELL region may include forming the WELL region having the another conductivity type in a Schottky barrier diode ("SBD") region.

The BODY region may have a depth that is less than a depth of the WELL region, and the depth of the WELL region may be less than a depth of the trench.

The counter doping region may be configured to reduce a net doping concentration at a top portion of the substrate.

In another general aspect, a semiconductor includes a substrate having a conductivity type, a counter-doping region having another conductivity type, and a metal layer in contact with the counter-doping region.

The semiconductor may include a Schottky barrier diode ("SBD") which includes the counter-doping region and the metal layer, wherein the substrate and the counter-doping region have different concentrations.

Other features and aspects will be apparent from the following detailed description, the drawings, and the claims.

Figure 1:
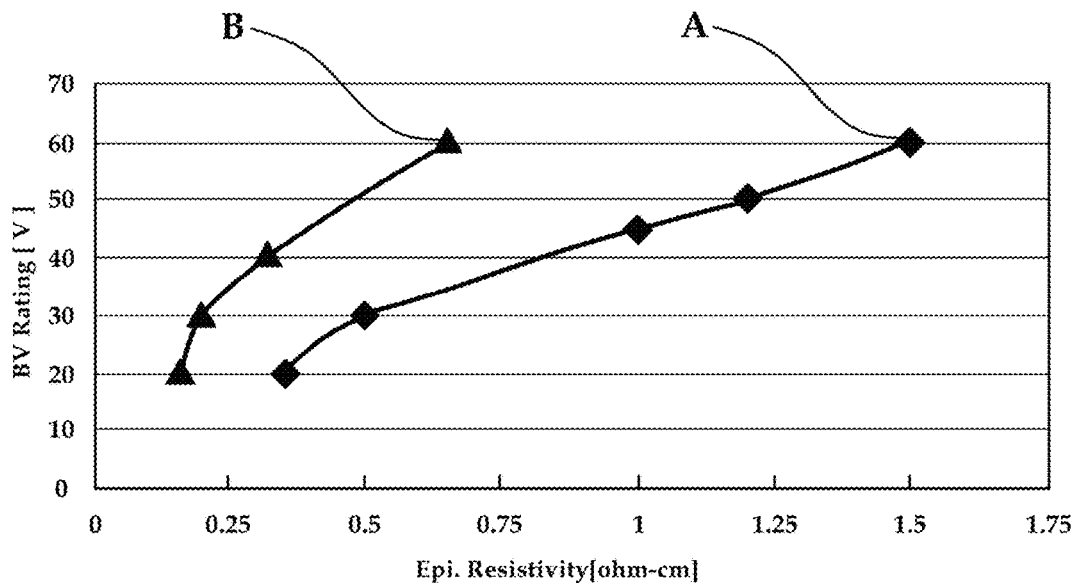
FIG. 1 is a diagram illustrating an example of a graph of a breakdown voltage value (BV) according to an EPI Resistivity of conventional MOSFET and SBD.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 2:
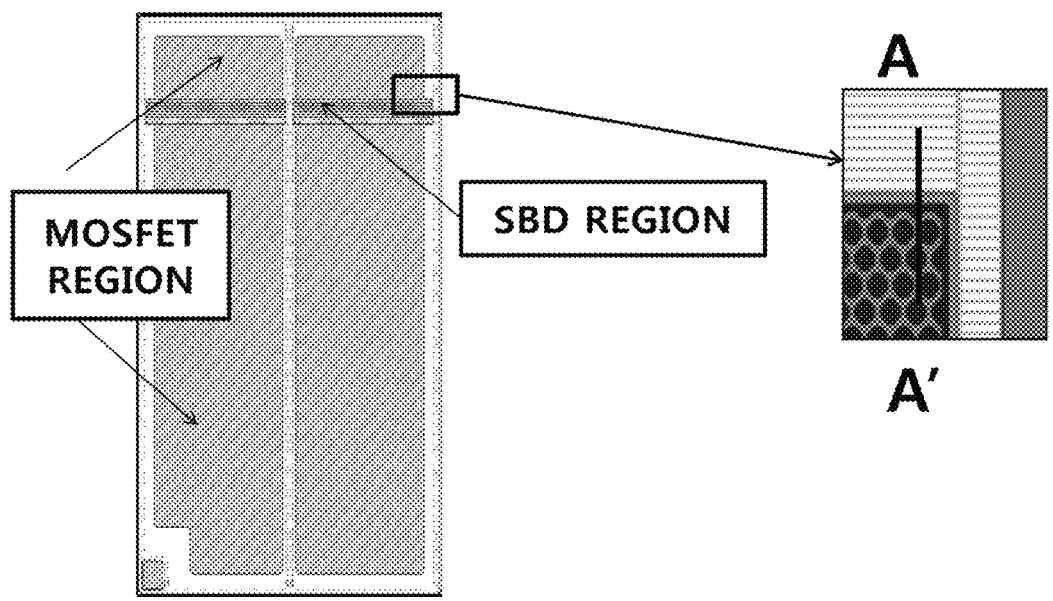
FIG. 2 is a diagram illustrating an example of a semiconductor device.

FIG. 2 is a diagram illustrating an example of a semiconductor device having an SBD region and a MOSFET active region configured in a Chip, as illustrated. In FIG. 2, the SBD region is formed at an upper portion of the chip; however, a position of the SBD region is not limited thereto.

Figure 3:
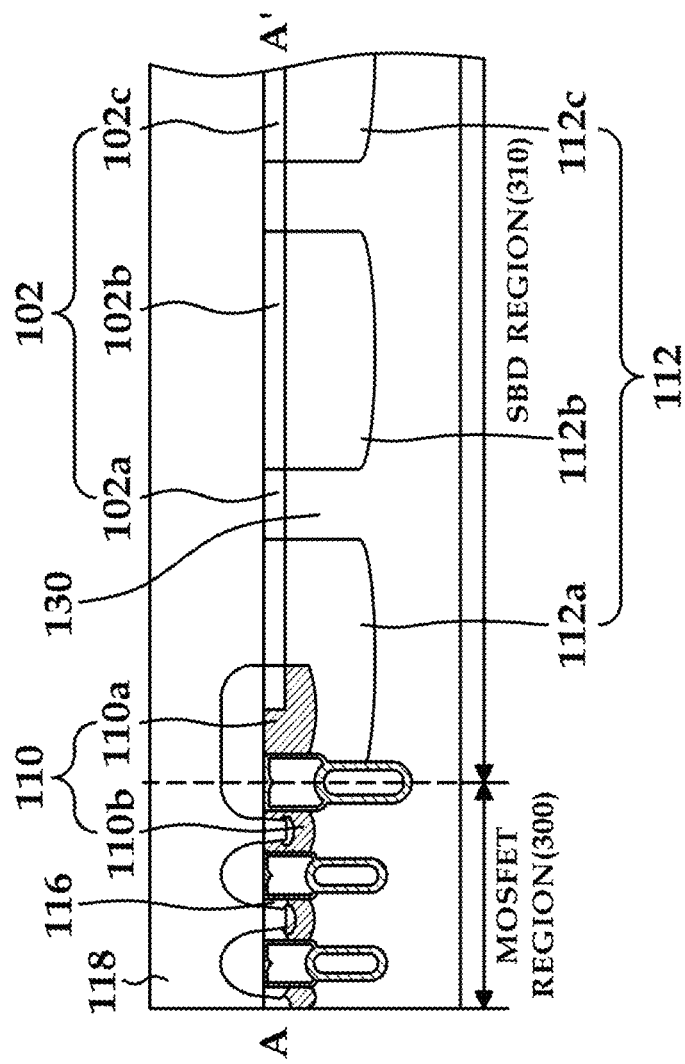
FIG. 3 is a diagram illustrating an example of a cross-sectional view where line A-A' of the semiconductor device of FIG. 2 is magnified.

FIG. 3 is a diagram illustrating an example of a cross-sectional view where the line A-A' on the semiconductor device of FIG. 2 is magnified. The MOSFET active region 300 consists of a plurality of various trenches. The rest regions and the SBD region 310 are disposed in such a way that the outermost trenches 104a are disposed in a boundary between the MOSFET active region 300 and the SBD region 310.

Figure 4:
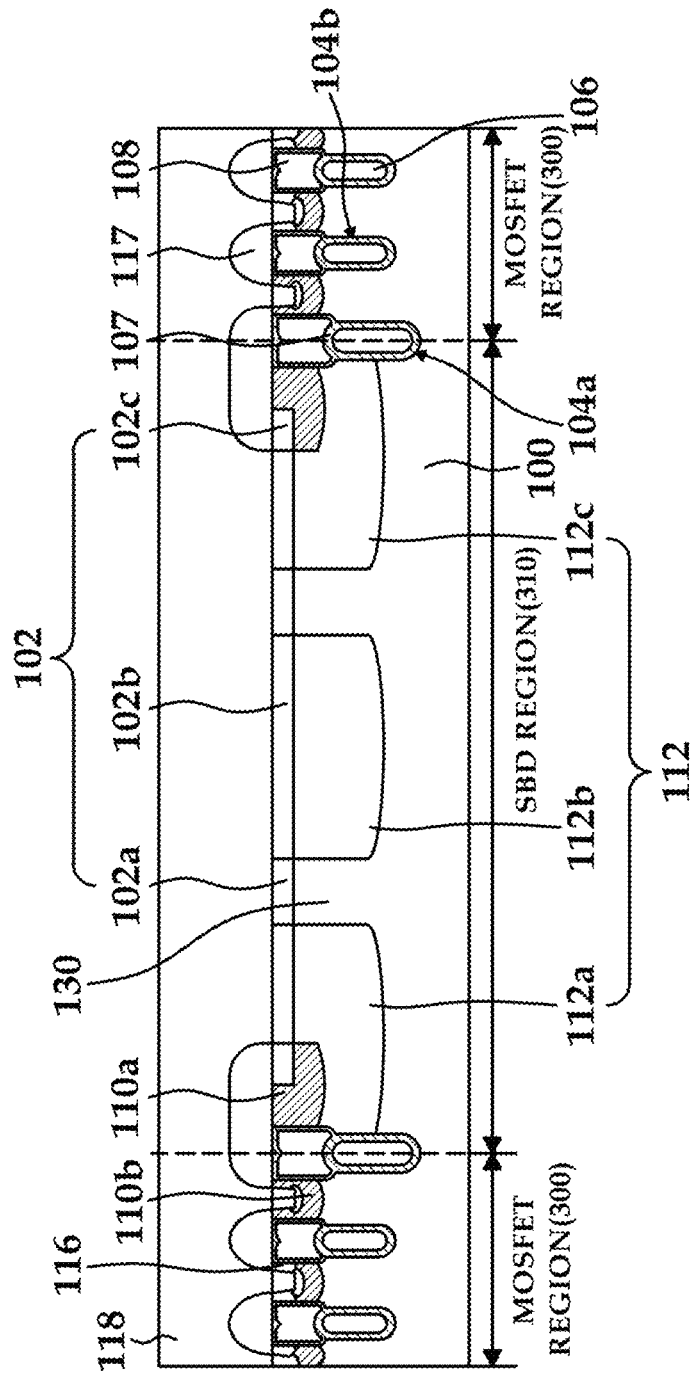
FIG. 4 is a diagram illustrating an example of a cross-sectional view of a semiconductor device.

FIG. 4 is a diagram illustrating an example of a cross-sectional view of a semiconductor device.

As illustrated in FIG. 4, the semiconductor device is embedded with an SBD, and has an EPI substrate 100 having a first conductivity type, for example, an N-type. The SBD comprises the P-type WELL region 112 and an N-type substrate 100.

A doping region 102 is formed in a top portion of the N-type substrate 100. The doping region is referred to as a counter doping region 102, in which a blanket implantation is performed having a second conductivity type that is opposite to the substrate 100. If a counter doping region 102 is formed by a counter doping process, a net doping concentration is locally reduced at the top portion of the substrate 100 compared to its bottom portion. Accordingly, a resistance in the top portion of an N-type EPI is slightly increased compared to its bottom portion, and thereby a breakdown voltage is improved.

The counter doping region 102 may include a first doping region 102a, a second doping region 102b, and a third doping region 102c. Each doping region 102a, 102b, 102c may have a different doping concentration.

In an example, various trenches 104 (104a, 104b) are disposed in the MOSFET active region. A first trench 104a is disposed in a boundary between the SBD region 310 and MOSFET region 300. A plurality of second trenches 104b is disposed in the MOSFET region 300. A plurality of WELL regions 112a, 112b and 112c is disposed in the SBD region 310. A first WELL region 112a and a third WELL region 112c are enclosed to the first BODY region 110a. The second WELL region 112b is disposed between the first WELL region 112a and the third WELL region 112c. A space between WELL regions is called an N-active region 130 and also contacts the metal layer 118. The N-active region 130 with metal layer works for a Schottky Barrier Diode (SBD).

A split-Poly-Si comprises a top Poly-Si 108, an insulating layer 107 and a bottom Poly-Si 106, and is disposed in the first trench 104a. However, the first trench 104a is not limited to be configured as a split Poly-Si and may be formed as a single Poly-Si.

Additionally, a metal layer 118 may be formed around an entire surface of the substrate 100.

An example of a method of manufacturing a semiconductor device configured as above will be described with reference to the accompanying drawings FIG. 5 to FIG. 14.

Figure 5:
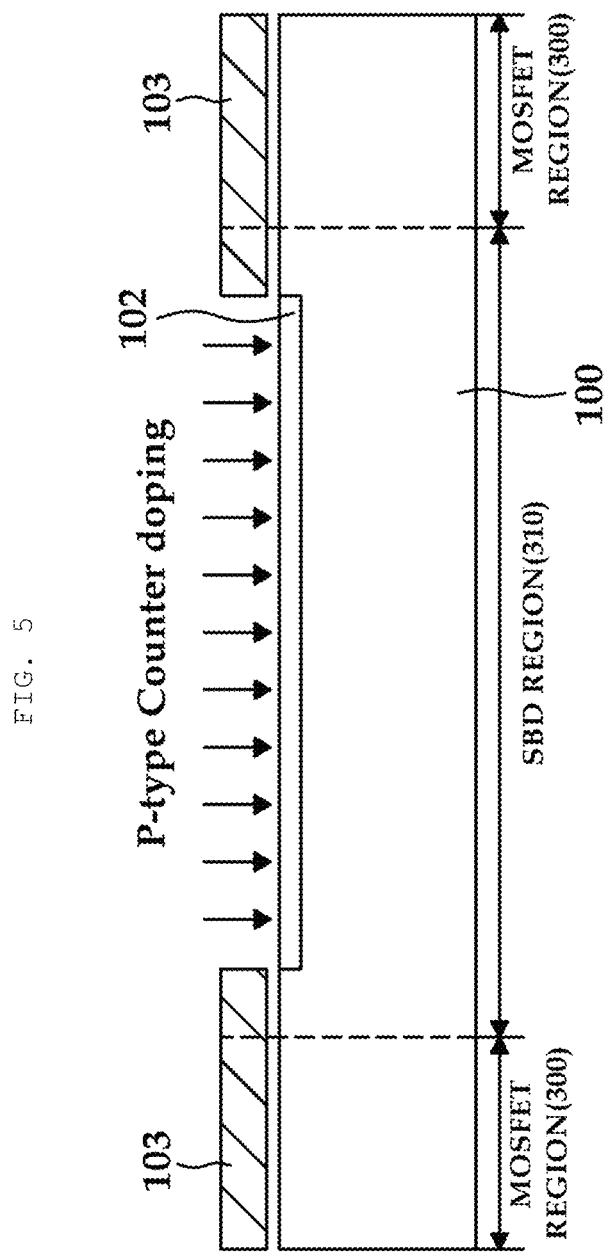
FIGS. 5, 6, 7, 8, 9, 10, 11, 12, 13, and 14 are diagrams illustrating an example of a manufacturing method of a semiconductor device embedded with a Schottky barrier diode.

FIG. 5 illustrates an example of a cross-sectional view of a semiconductor device in which a counter doping 102 of the active region is performed. That is, in this example, the LOCOS process is complete.

As illustrated in FIG. 5, an N-type EPI substrate 100 is the starting material. A counter doping region 102, in which a doping is performed by the P-type dopant, is formed on a top portion of the N-type EPI substrate 100. Boron fluoride (BF2) or Boron (B) may be used as the P-type dopant for the counter doping process. Counter doping generally means doping an impurity in order to control electrical characteristic of the semiconductor device, such as concentration, resistivity, etc., and the impurity may differ according to the types of the semiconductor.

In an example, reducing a net doping concentration at the SBD region by performing a counter doping of P-type dopant reduces N-type dopant concentration at the Epitaxial layer surface. In this case, when performing the counter doping, a counter doping region 102 is formed by using the SBD mask 103 after identifying the region where the SBD will be substantially formed. This is because a counter doping in the partial portion of the SBD region 310 may cause overall characteristics of the semiconductor device to be degraded when doping is performed on an entire surface of the substrate.

A doping concentration of conductivity type N at a substrate may be reduced, and a breakdown voltage may be enhanced by increasing the N-type EPI surface resistance. This may be performed by forming a counter doping region 102 in the partial region including the SBD region 310, as described above.

Figure 6:
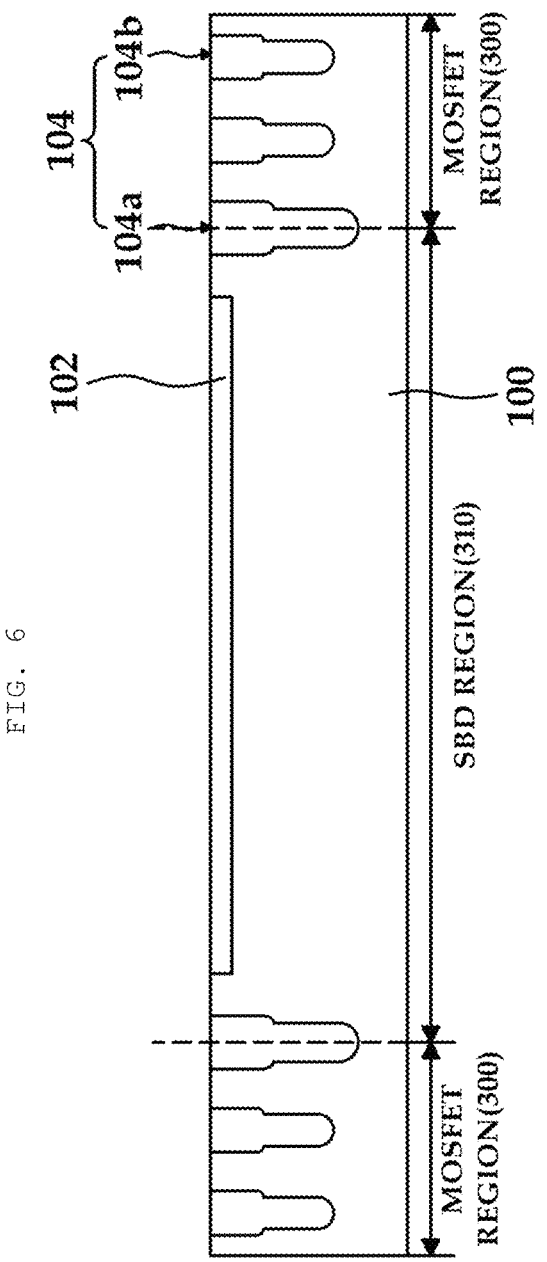

In this example, one or more trenches 104a, 104b are formed in the MOSFET region 300. FIG. 6 is a diagram illustrating an example of a first trench 104a that is formed. As illustrated, the first trench 104a is formed by being etched at a certain depth from the surface of the N-type EPI substrate 100. The first trench 104a and the second trench 104b may be separated from each other at a certain distance. A termination trench adjacent to the third doping region 102c (FIG. 4), i.e., first trench 104a, is formed to be deeper than a depth of second trench 104b. It is preferred that a length of the first trench 104a is equal to or deeper than that of the second trench 104b. Additionally, a width of the first trench 104a may be equal to or wider than that of the second trench 104b. If the length of the first trench 104a is shorter, a stable internal breakdown voltage may not be obtained. Thus, it is preferred that the length of the first trench 104a is longer than that of the second trench 104b.

Meanwhile, the trenches 104 may be filled with the top Poly-Si 108 and bottom Poly-Si 106, where the top Poly-Si 108 is separated from bottom Poly-Si 106 by an internal insulating layer 107. However, in other examples, the trenches 104 may be filled with one single Poly-Si in which a top Poly-Si and a bottom Poly-Si are merged together.

In this example, the counter doping region 102 is formed before the first trench 104a is formed; however, the order is not limited thereto. That is, the first trench 104a of FIG. 6 may be formed before the counter doping region 102.

Figure 7:
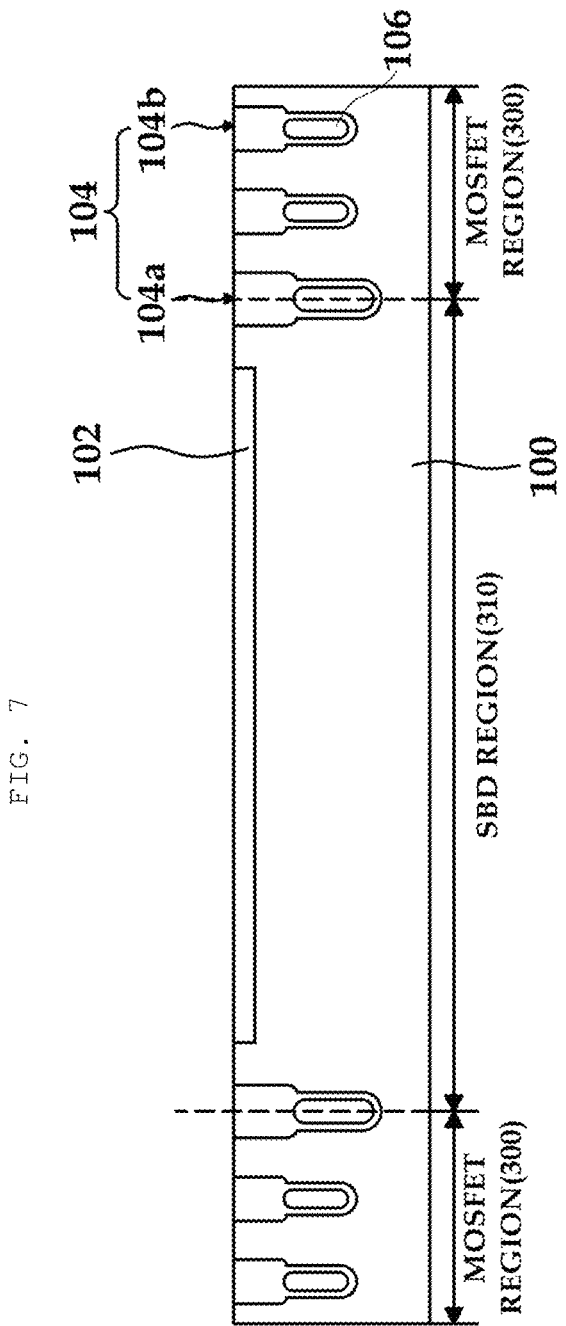

As illustrated in FIG. 7, a bottom Poly-Si 106 is formed first in the first trench 104a among the split Poly-Si inside the trench region 104. It is preferred that the bottom Poly-Si 106 is a source Poly-Si but the bottom Poly-Si 106 is not limited thereto.

Figure 8:
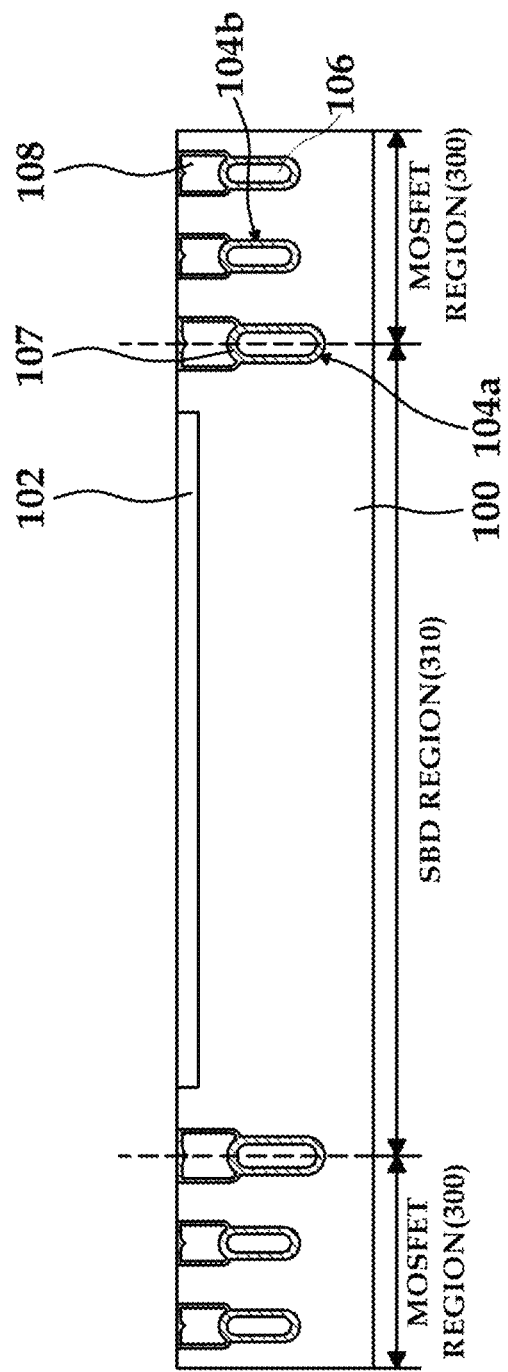
Figure 9:
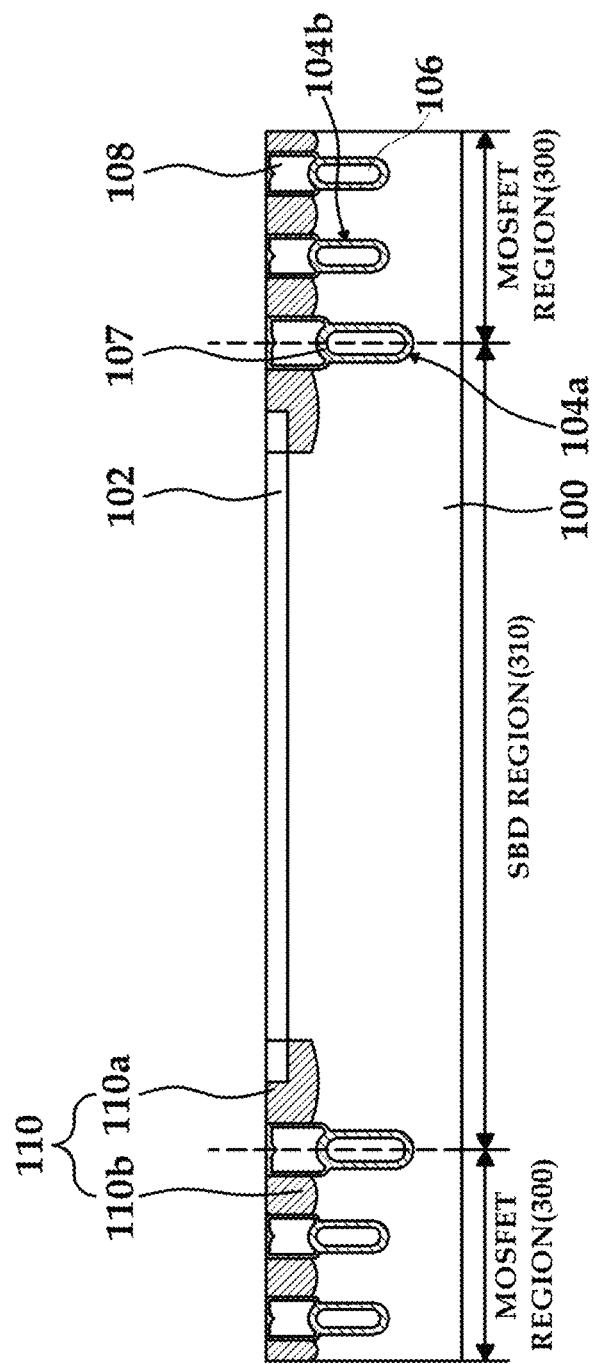

As illustrated in FIGS. 7 and 9, an oxide layer 107 is formed inside the trench after a bottom Poly-Si 106 is formed at the bottom portion of the trench. After forming the oxide layer 107, a gate Poly-Si (Top Poly-Si) 108 may be formed at the upper portion of the trench, as illustrated in FIG. 8.

FIG. 9 is a diagram illustrating an example of a cross-sectional view of a semiconductor device after performing a P-type doping in order to form the first BODY region 110a. As illustrated in FIG. 9, the first BODY region 110a partially overlaps with the first WELL region 112a (FIG. 4), and is formed in the SBD region 310. On the other hand, the second BODY region 110b is disposed between the trench regions 104 in the MOSFET region 300. A depth of the BODY region 110a may not be deeper than that of the upper Poly-Si 108 of the trench region 104, and the depths may be identical to each other. If the BODY region 110a is deeper than a depth of the upper Poly-Si region 108, a voltage may increase according to the increase of the channel region formation, and further, the entire semiconductor device may be affected.

The WELL regions 112a, 112b and 112c are formed with the same conductivity type as the BODY region 110. The WELL region 112a, 112b and 112c may be separated from each other at a certain distance and may have almost the same width. Depths of the WELL regions 112a, 112b and 112c may be deeper than a depth of the BODY region 110. Furthermore, the WELL regions 112a, 112b and 112c may have lower depths than the first trench 104a. If the WELL regions 112a, 112b and 112c are formed to be longer than the bottom Poly-Si 106 of the first trench 104a, the MOSFET function may be degraded.

Figure 10:
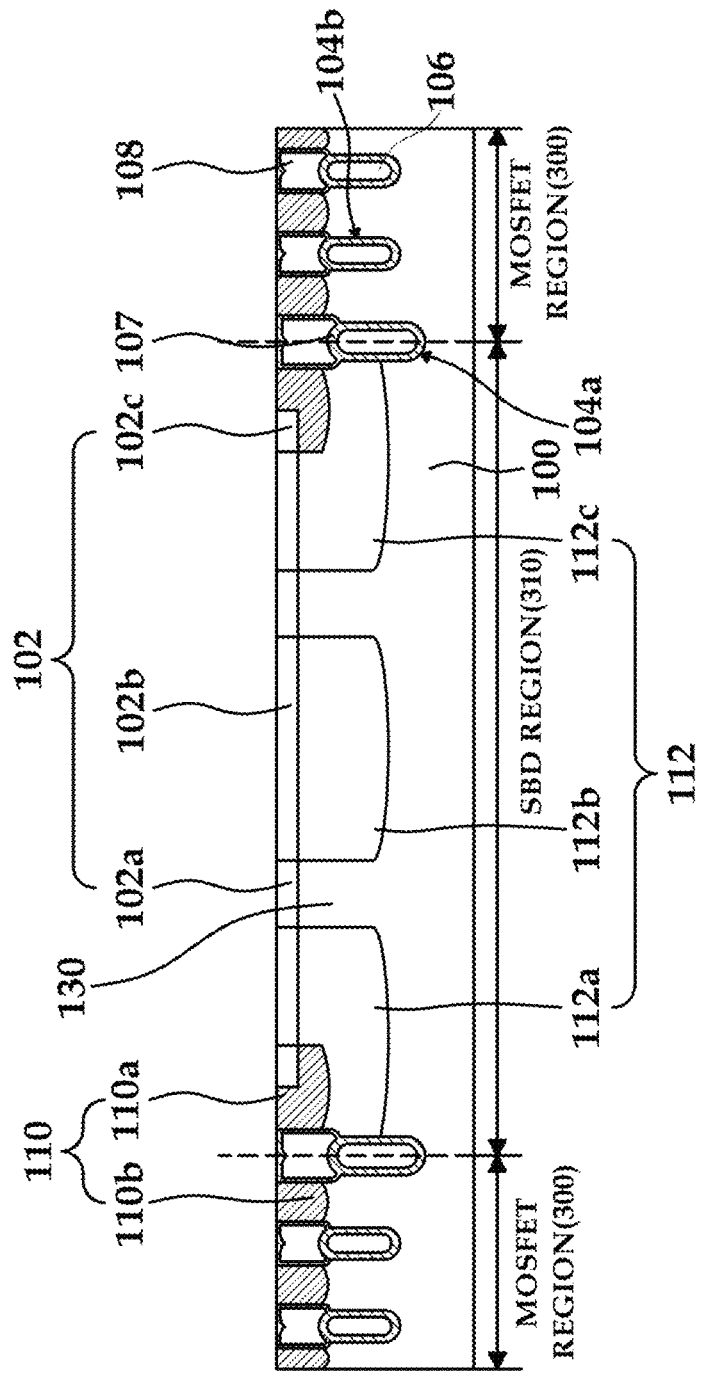

In the example illustrated in FIG. 10, each doping region 102a-102c has a different doping concentration, and the dopant implanted into the doping regions 102a-102c has a different conductivity type from the substrate 100.

The counter doping region 102 includes at least a first doping region 102a, a second doping region 102b, and a third doping region 102c. Each doping region 102a, 102b, 102c has a different doping concentration. The first doping region 102a is disposed in a portion of the substrate 100. Net doping concentration of the first region 102a is lower than the substrate 100 because the dopant implanted into the first region 102a has conductivity type opposite to the substrate. The second doping region 102b is disposed in the WELL regions 112a, 112b and 112c. The net doping concentration of the second region 102b is increased locally compared to the WELL region 112 because a dopant having the same conductivity type with the WELL region 112 is implanted into the second region 102b. The third doping region 102c is disposed in the first BODY region 110a. Similarly to the second region 102b, the net doping concentration of the third region 102c is increased locally compared to the BODY region 110 because a dopant having the same conductivity type with the BODY region 110 is implanted into the third region 102c.

Figure 11:
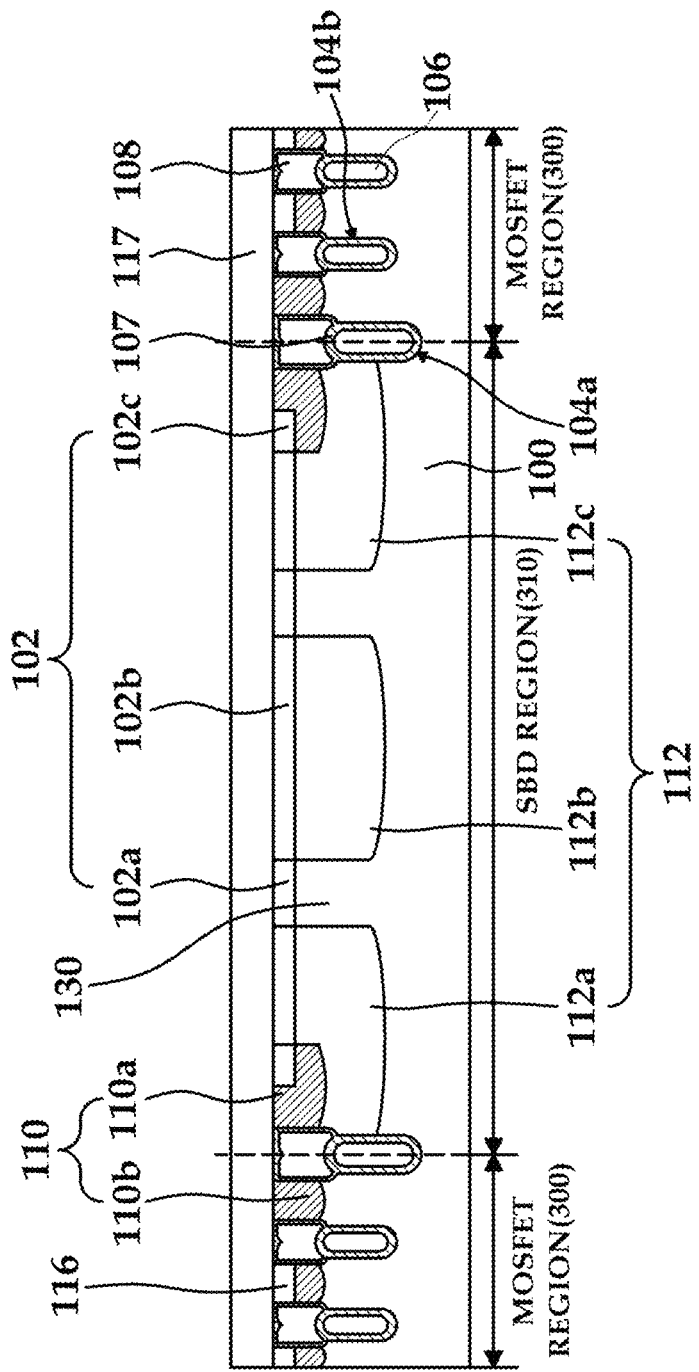

A source region 116 is formed in the partial portion of the BODY region 110. A source region 116 having a different conductivity type from the BODY region 110 is formed. FIG. 11 is a diagram illustrating an example of a cross-sectional view of the semiconductor device after performing doping by the conductivity type N, in order to form a source region 116 in the MOSFET region 300. The source region 116 is formed by doping the upper portion of the substrate between the second trenches 104b using the conductivity type N. Further, the source region 116 has a shorter depth than the upper Poly-Si 108 of the second trench 104b and a shallower depth than the BODY region 110a.

As illustrated in FIG. 11, after forming the source region 116, an insulating layer 117 is formed at the upper surface of the N-type EPI substrate 100.

Figure 12:
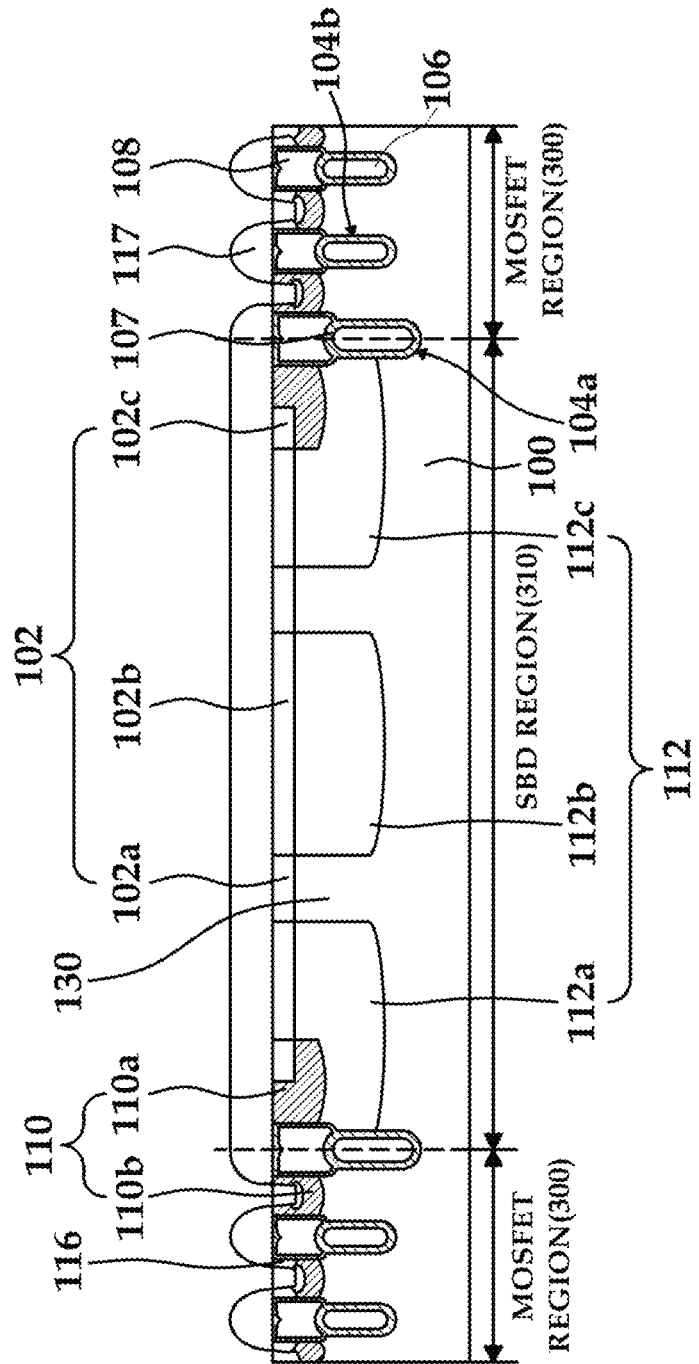

FIG. 12 is a diagram illustrating an example of a patterning of a region where a contact plug is formed to be opened toward the insulating layer 117 by using a mask (not illustrated) in order to form a contact plug in the MOSFET region 300. As illustrated in FIG. 12, a portion of the source region 116 is etched. Through the etching, the contact plug may contact the source region 116 and BODY region 110.

Figure 13:
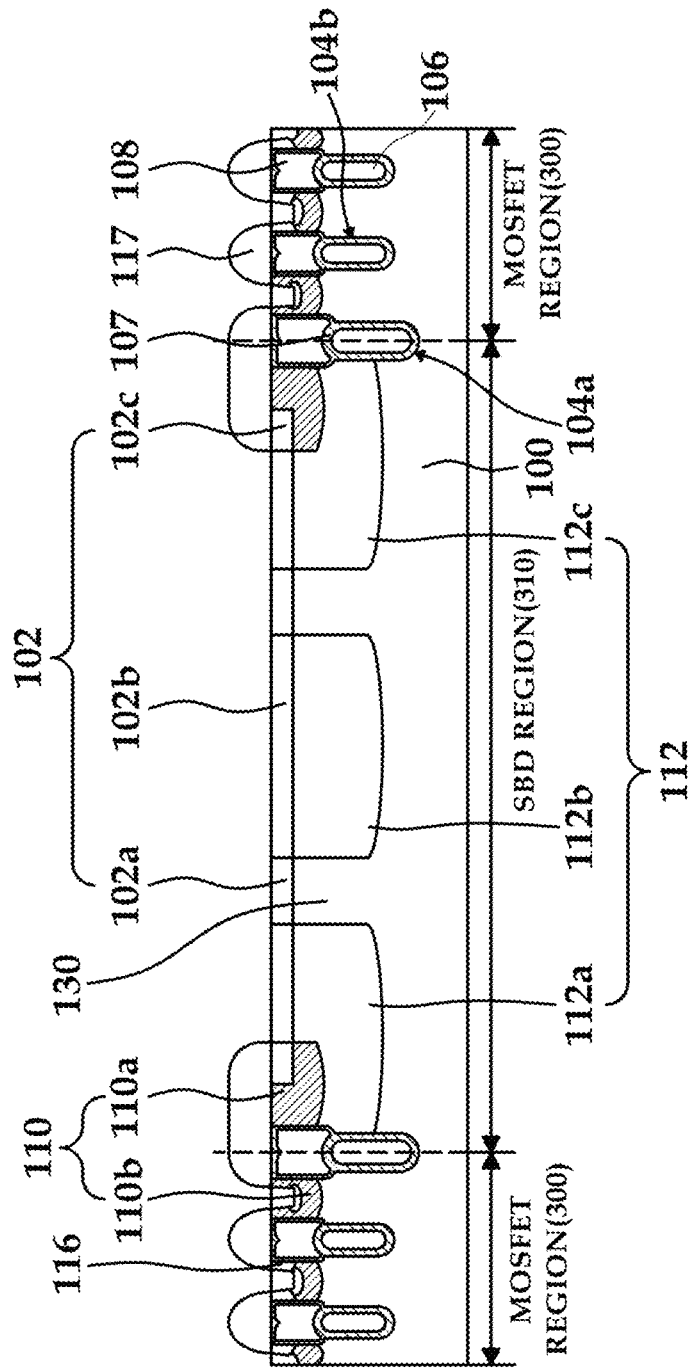

Thereafter, as illustrated in FIG. 13, the upper surface of the SBD region 310 is selectively opened using patterning process. The insulating layer 117 over the upper surface of the SBD region 310 is selectively removed through a wet etching process which induces less damage to the upper surface of the SBD region 310. The contact plug may contact the SBD region 310. In this example, the insulator layer 117 still partially covers the BODY portion 110 and the source region 116. Thereafter, a metal layer 118 may be deposited over the substrate to make contact with the BODY region 110, the source region 116, and the SBD region 310. A metal layer 118 may contact the counter doping region 102 as well as the WELL regions 112a, 112b and 112c. Aluminum (Al) metal or Copper (Cu) metal or TiN or Ti barrier metal may be used as the metal layer 118.

Figure 14:
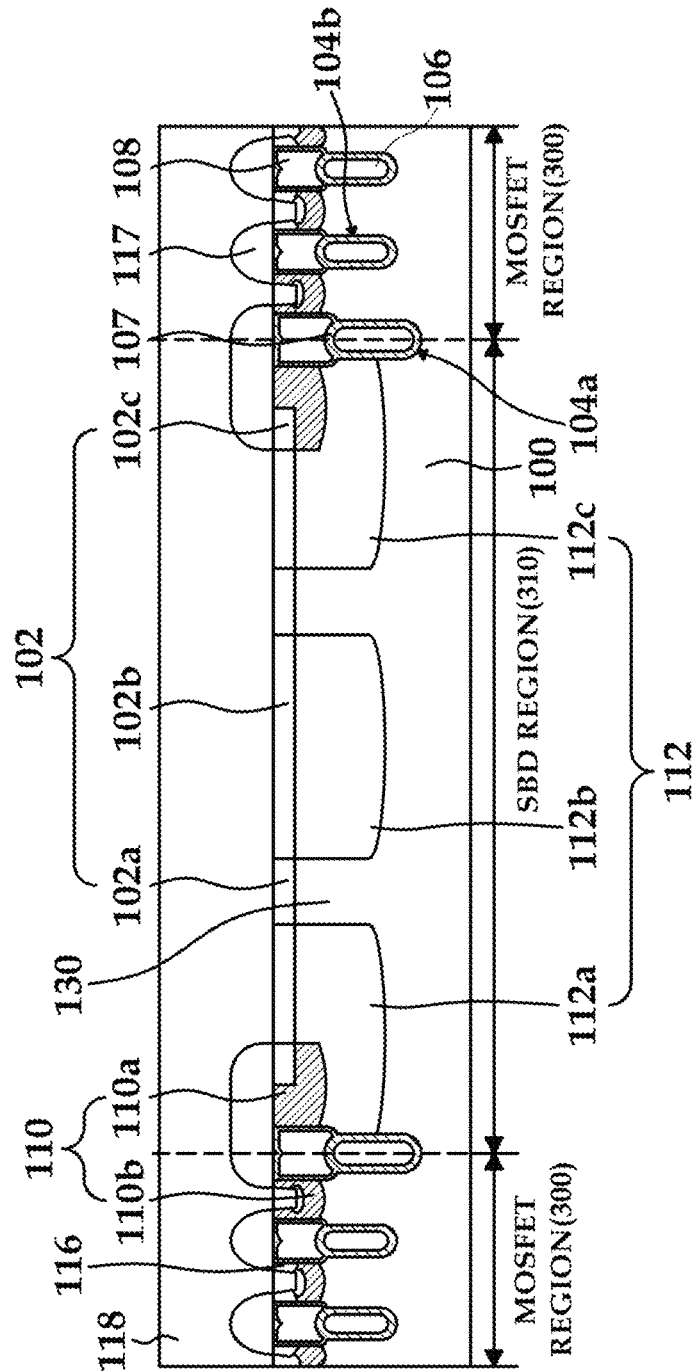

FIG. 14 is a diagram illustrating an example of a cross-sectional view of a semiconductor device with the metal layer 118. A silicide layer (not shown) such as cobalt silicide (CoSi2), titanium silicide (TiSi2), and nickel silicide (NiSi) may be formed prior to the deposition of the metal layer 118.

The above description provides a semiconductor device embedded with a Schottky barrier diode configured to reduce an N-type doping concentration at a surface of the N-type EPI substrate 100 by using the counter doping implantation. The resistance near the surface of the N-type EPI substrate 100 may be increased through the counter doping process. Thus, a breakdown voltage of the whole semiconductor device can be increased.

The increase of the breakdown voltage of the semiconductor device according to the counter doping process is illustrated in FIGS. 15 to 17.

FIGS. 15 and 16 are diagrams illustrating example graphs of doping concentrations, according to depths of a semiconductor device in which a counter doping is not performed, and a semiconductor device whose SBD region is performed with counter doping.

Figure 15A:
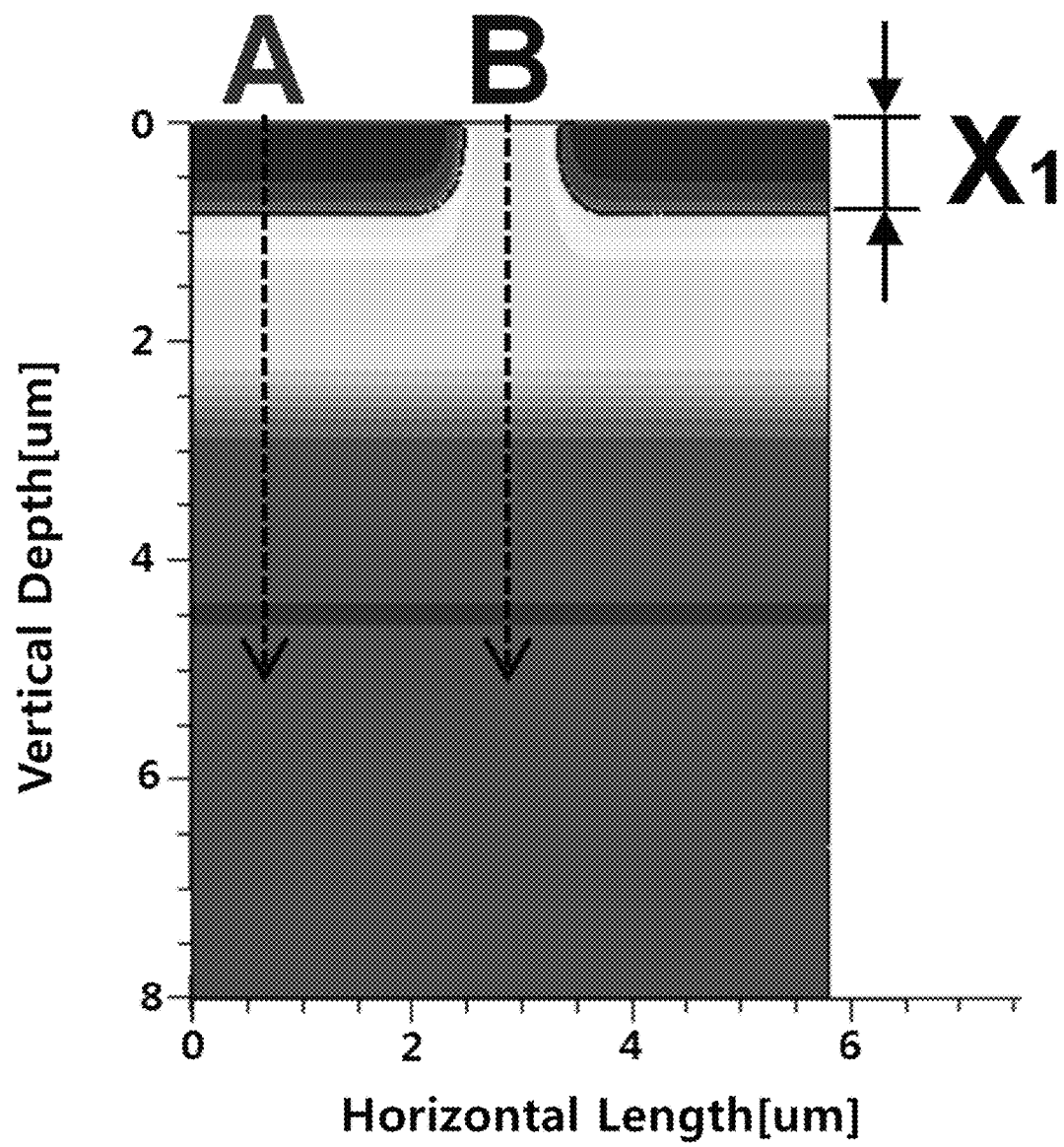
FIGS. 15a and 15b are diagrams illustrating an example of graphs of doping concentration changes of a semiconductor device embedded with the SBD according to whether counter doping is performed or not.
Figure 15B:
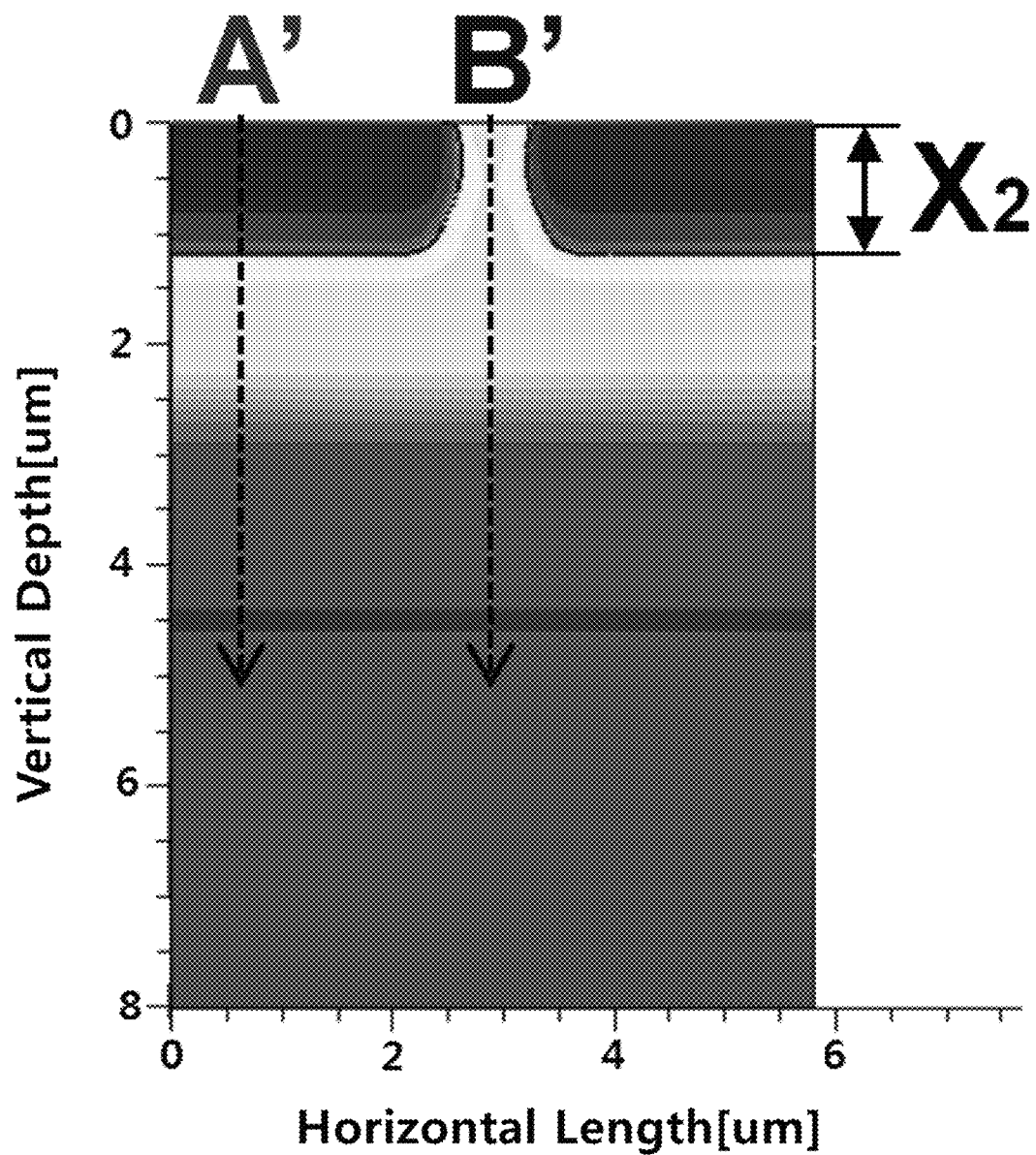

FIG. 15a is a diagram illustrating an example of a doping concentration change of a semiconductor device in which counter doping is not performed. FIG. 15b is a diagram illustrating an example of a doping concentration change of a semiconductor device in which counter doping is performed.

In FIG. 15a, "A" represents a region that ranges from an upper portion to a bottom portion of a substrate of a WELL region in the semiconductor device embedded with the SBD in which a counter doping is not performed. In FIG. 15a, "B" represents a region that ranges from an upper portion to a bottom portion of a substrate of the semiconductor device embedded with the SBD in which a counter doping is not performed. X1 represents a thickness of the WELL region of the semiconductor device embedded with the SBD in which a counter doping is not performed.

In FIG. 15b, "A'" represents a region that ranges from an upper portion to a bottom portion of a substrate of the WELL regions 112a, 112b and 112c including the counter doping region 102. In FIG. 15b, "B'" represents a region that ranges from an upper portion to a bottom portion of a substrate including the counter doping region 102. X2 represents a thickness of the WELL region of the semiconductor device embedded with the SBD in which counter doping is performed.

Referring to FIGS. 15a and 15b, it should be appreciated that the thickness (X2) of the WELL region of the semiconductor device with counter doping is deeper than a thickness (X1) of the WELL region of the semiconductor device without counter doping. This is because the WELL region is formed by the same conductivity type as the counter doping's conductivity type.

Figure 16A:
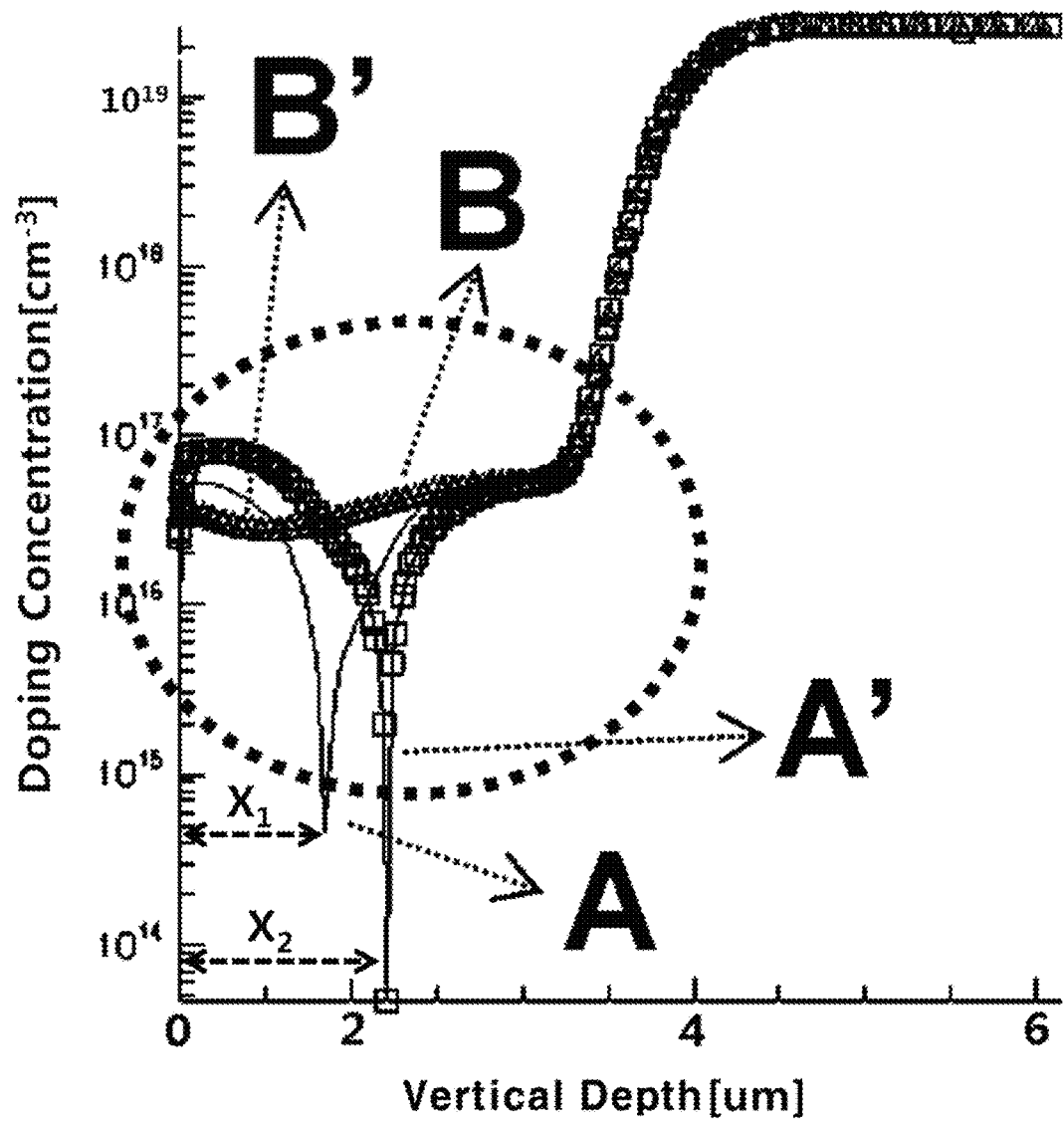
FIGS. 16a and 16b are diagrams illustrating an example of graphs of doping concentration changes of a semiconductor device embedded with the SBD according to whether counter doping is performed or not.
Figure 16B:
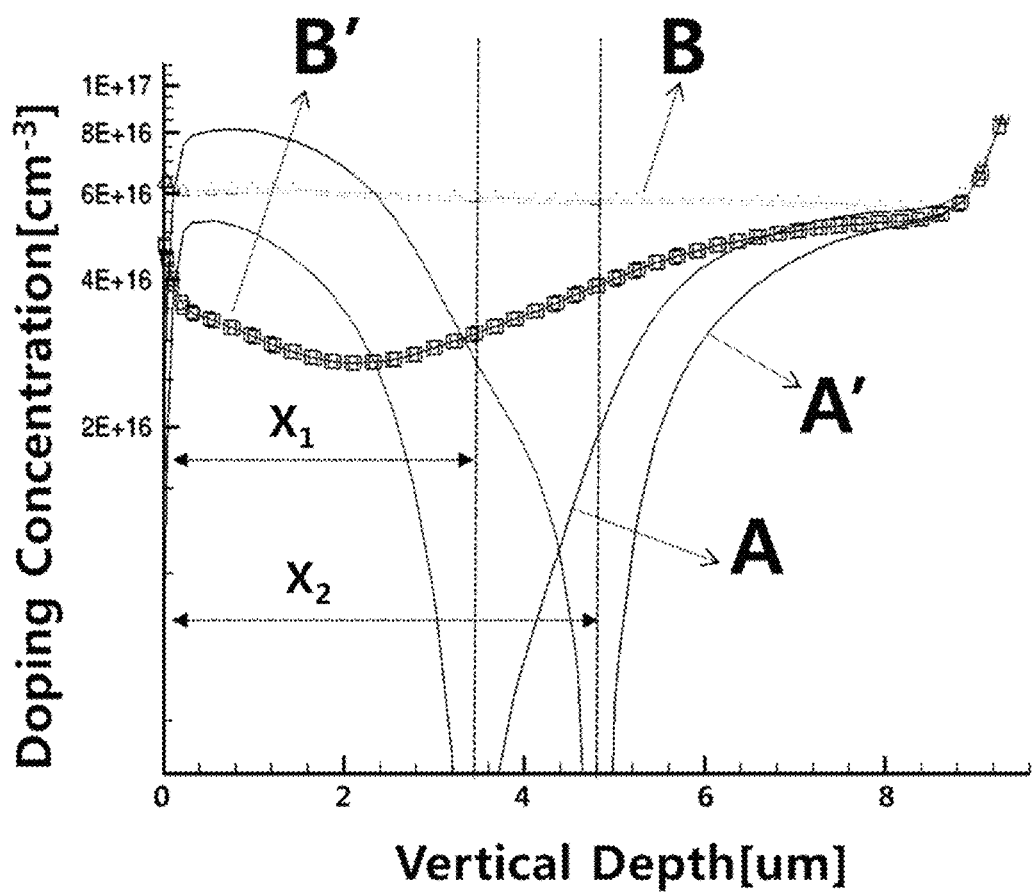

FIGS. 16a and 16b are diagrams illustrating an example of graphs of net doping concentration profiles according to A, A', B, B' which are illustrated in FIGS. 15a and 15b. FIG. 16b is a diagram illustrating an example of a graph that shows a magnified portion in FIG. 16a with a dotted line.

In FIGS. 16a and 16b, the X-axis of the graphs represents a depth from a top surface of the substrate, and the Y-axis of the graphs represents a net doping concentration. Once counter doping is performed (A'), the junction depth of the WELL region, X2 extends beyond 2 μm. On the other hand, without a counter doping process, the junction depth of the WELL region, X1 does not extend to 2 μm. The counter doping process extends the junction depth deeper than without counter doping. The result corresponds to a thickness difference between X1 and X2 as shown in FIGS. 15a and 15b.

Furthermore, a doping concentration (B) on the substrate without counter doping is constant according to a depth from the substrate surface, as illustrated in FIG. 16b. Whereas, in the case of counter doping being performed (B'), a smaller doping concentration is shown at the top portion of the substrate up to 8 μm.

According to various aspects, the semiconductor device having the SBD region where a counter doping is partially performed can ultimately reduce a net doping concentration of a conductivity type N on a substrate surface through counter doping.

Eventually, due to the lowered doping concentration of the conductivity type N on the surface, a resistance value of an N-type EPI surface is high, and an internal resistance in the SBD region is high. The result can be understood through a comparison between FIGS. 17a and 17b.

Figure 17A:
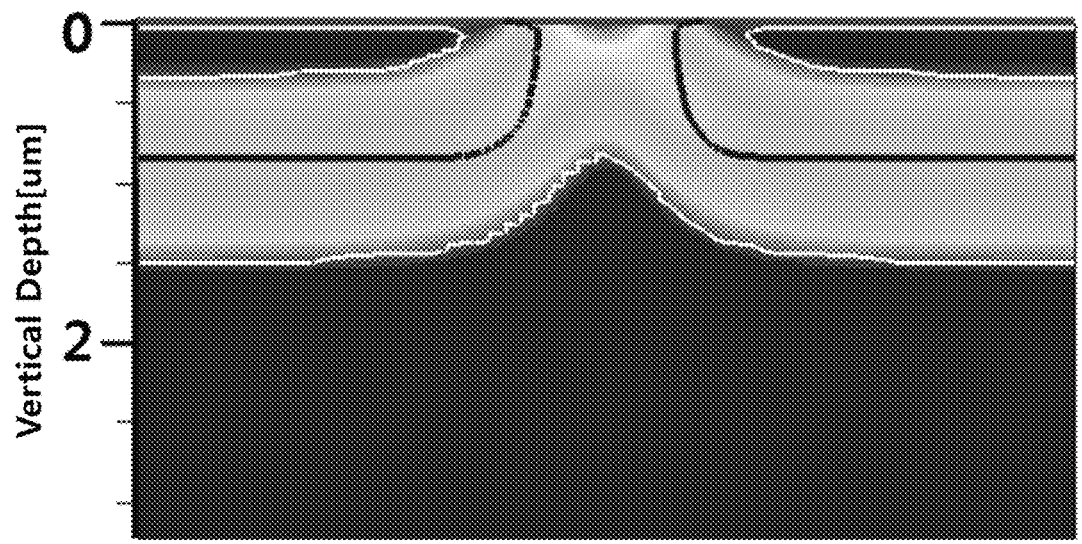
FIGS. 17a and 17b are diagrams illustrating an example of graphs of an electric field distribution of a semiconductor device embedded with the SBD according to whether counter doping is performed or not.
Figure 17B:
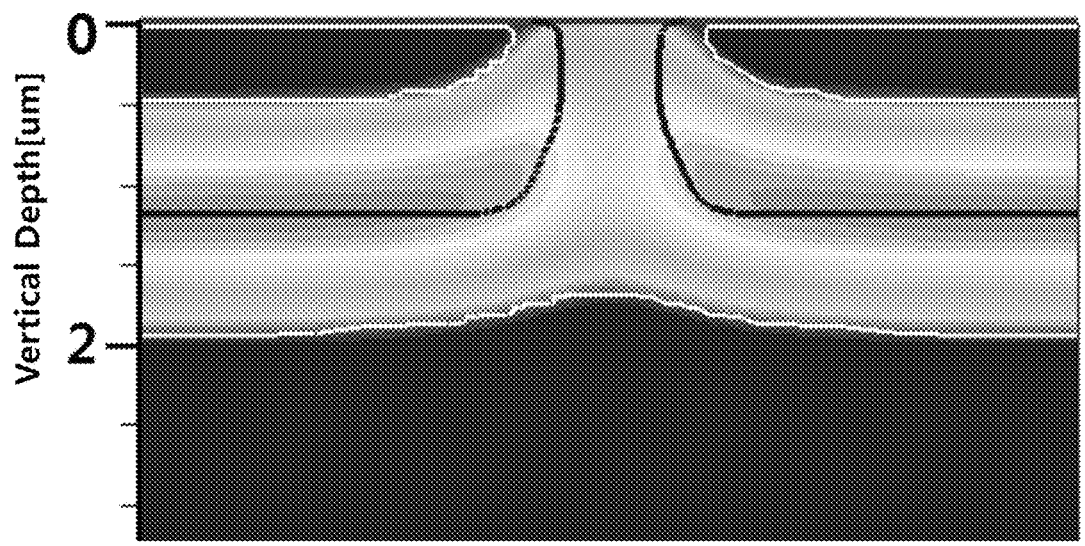

FIG. 17a is a diagram illustrating an example of an Electric Field distribution of a semiconductor device without counter doping, and FIG. 17b is a diagram illustrating an example of an Electric Field distribution of a semiconductor device embedded with the SBD with counter doping. By comparing FIGS. 17a and 17b, it should be appreciated that an electric filed of the substrate surface where counter doping is performed is smaller than where counter doping is not performed.

A breakdown voltage of a semiconductor device according to an example may be 39.4 V. Compared with the breakdown voltage value of 8.9 V of a semiconductor device where counter doping is not performed, it can be appreciated that a breakdown voltage value of a semiconductor device embedded with a Schottky barrier diode is largely improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
    a substrate having a first doping concentration and comprising a Schottky barrier diode ("SBD") region and a MOSFET region, the SBD region comprising a counter doping region in an upper portion of the substrate and a well region; and
    a first trench disposed on a boundary line between the SBD region and the MOSFET region,
    wherein the counter doping region has a second doping concentration, and
    the counter doping region comprises a first doping region disposed in an upper portion of the SBD region and located outside the well region, and a second doping region disposed in an upper portion of the well region.

2. The semiconductor device of claim 1, further comprising a metal layer in contact with the counter doping region,
    wherein the substrate has a first conductivity type, and
    wherein the second doping concentration is lower than the first doping concentration.

3. The semiconductor device of claim 2, further comprising a body region which has a second conductivity type and is disposed in the substrate.

4. A semiconductor device comprising:
    a substrate having a first doping concentration and comprising a Schottky barrier diode ("SBD") region and a MOSFET region, the SBD region comprising a counter doping region, a well region and a body region,
    wherein the substrate has a first conductivity type, and the body region disposed in the substrate has a second conductivity type,
    wherein the counter doping region has a second doping concentration and comprises a first doping region extending outside the well region from a second doping region disposed in the well region, and
    wherein the counter doping region further comprises a third doping region disposed in the body region.

5. The semiconductor device of claim 4, wherein the third doping region has a higher doping concentration than that of the second doping region.

6. The semiconductor device of claim 1, further comprising a second trench having a second depth in the substrate,
    wherein the first trench has a first depth in the substrate different than the second depth.

7. The semiconductor device of claim 3, wherein
    the body region comprises a first body region and a second body region;
    the well region comprises a first well region, a second well region, and a third well region; and
    the first body region is enclosed by the first well region or the third well region.

8. The semiconductor device of claim 6, wherein the first trench comprises a top Poly-Si layer, a bottom Poly-Si layer, and an insulating layer which is disposed between the top Poly-Si layer and the bottom Poly-Si layer.

9. The semiconductor device of claim 3, wherein the body region has a smaller depth than the well region.

10. The semiconductor device of claim 6, wherein a depth of the well region is less than a depth of the first trench.

11. A semiconductor device, comprising:
    a substrate having a first conductivity type;
    a first well region and a second well region, each of a second conductivity type, disposed in a Schottky barrier diode ("SBD") region;
    a counter doping region disposed in the SBD region, the counter doping region comprising a first doping region extending outside the first well region from a second doping region in the first well region;
    a first trench having a first depth in the substrate, and a second trench having a second depth in the substrate which is different than the first depth; and
    a metal layer in contact with the first doping region and the second doping region.

12. The semiconductor of claim 11, wherein the substrate and the counter doping region have different doping concentrations.

13. The semiconductor of claim 11, comprising a body region of the second conductivity type disposed in the substrate, wherein the counter doping region comprises a third doping region disposed in the body region.

14. A semiconductor device, comprising:
    a Schottky barrier diode ("SBD") region;
    a well region having a first depth and disposed in the SBD region;
    a substrate in the SBD region having a first doping concentration;
    a trench having a second depth and disposed in the substrate, the second depth being greater than the first depth;
    a counter doping region having a second doping concentration different than the first doping concentration and having a depth shallower than a depth of the well region, the counter doping region comprising a first doping region where the counter doping region and the substrate intersect extending from a second doping region where the counter doping region and the well intersect; and
    a metal layer in contact with the first doping region and the second doping region.

15. The semiconductor device of claim 14, wherein the first doping region has a different doping concentration than an other region of the substrate, which causes a difference in resistance to exist between different portions of the substrate to affect a breakdown voltage.

16. The semiconductor device of claim 3, wherein the counter doping region further comprises a third doping region disposed in the body region.

17. The semiconductor device of claim 16, wherein the third doping region has a higher doping concentration than that of the second doping region.

* * * * *